(12) United States Patent
Yang

(10) Patent No.: US 7,061,826 B2
(45) Date of Patent: Jun. 13, 2006

(54) COMMAND DECODER OF SEMICONDUCTOR MEMORY DEVICE

(75) Inventor: Sun Suk Yang, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/908,549

(22) Filed: May 16, 2005

(65) Prior Publication Data

US 2006/0104148 A1 May 18, 2006

(30) Foreign Application Priority Data

Nov. 15, 2004 (KR) ...................... 10-2004-0093179

(51) Int. Cl.
*G11C 8/00* (2006.01)
(52) U.S. Cl. ............. 365/233; 365/230.08; 365/185.19
(58) Field of Classification Search ................ 365/233, 365/189.07, 189.05, 189.04, 230.08, 185.19, 365/191, 185.22
See application file for complete search history.

(56) References Cited

U.S. PATENT DOCUMENTS

| | | | | |
|---|---|---|---|---|
| 5,973,988 A | 10/1999 | Nakahira et al. | ...... | 365/230.08 |
| 6,026,041 A | 2/2000 | Suzuki et al. | ................ | 365/203 |
| 6,111,810 A | 8/2000 | Fujita | ..................... | 365/230.06 |
| 6,295,238 B1 * | 9/2001 | Tanizaki et al. | ............. | 365/201 |
| 6,456,563 B1 * | 9/2002 | Kajimoto | ..................... | 365/233 |
| 6,483,579 B1 * | 11/2002 | Koshikawa | .................. | 356/233 |
| 6,483,769 B1 | 11/2002 | La | ............................... | 365/233 |
| 6,545,940 B1 * | 4/2003 | Sugamoto et al. | ........... | 365/233 |
| 6,757,214 B1 | 6/2004 | Kawaguchi et al. | ........ | 365/233 |
| 6,868,020 B1 | 3/2005 | Aoki | .......................... | 365/200 |
| 2003/0081491 A1 | 5/2003 | Miki | .......................... | 365/233 |
| 2003/0223293 A1 | 12/2003 | Kawaguchi et al. | ........ | 365/200 |
| 2004/0008560 A1 | 1/2004 | Aoki | .......................... | 365/222 |
| 2004/0114423 A1 | 6/2004 | La | .............................. | 365/154 |
| 2005/0141333 A1 * | 6/2005 | Fujisawa | ..................... | 365/233 |

FOREIGN PATENT DOCUMENTS

| | | |
|---|---|---|
| JP | 11096760 | 4/1999 |
| JP | 2000030464 | 1/2000 |
| JP | 2000113669 | 4/2000 |
| JP | 2004005821 | 1/2004 |
| JP | 2004046927 | 2/2004 |
| JP | 2005-158127 | 6/2005 |

* cited by examiner

*Primary Examiner*—Richard Elms
*Assistant Examiner*—Dang Nguyen
(74) *Attorney, Agent, or Firm*—Marshall, Gerstein & Borun LLP

(57) ABSTRACT

A command decoder is provided for controlling internal circuits of a semiconductor chip to operate in synchronism with a first internal clock signal having a pulse width, which is twice as wide as that of an external clock signal, and a second internal clock signal having an opposite phase to the first internal clock signal. An internal operation controller controls internal circuits of a semiconductor chip to operate in synchronism with a first internal clock signal having a pulse width, which is N times as wide as that of an external clock signal, if the command signal is received at a first rising edge of the external clock signal, and controls the internal circuits of the semiconductor chip to operate in synchronism with a second internal clock signal having an opposite phase to the first internal clock signal, if the command signal is received at a second rising edge of the external clock signal.

11 Claims, 3 Drawing Sheets

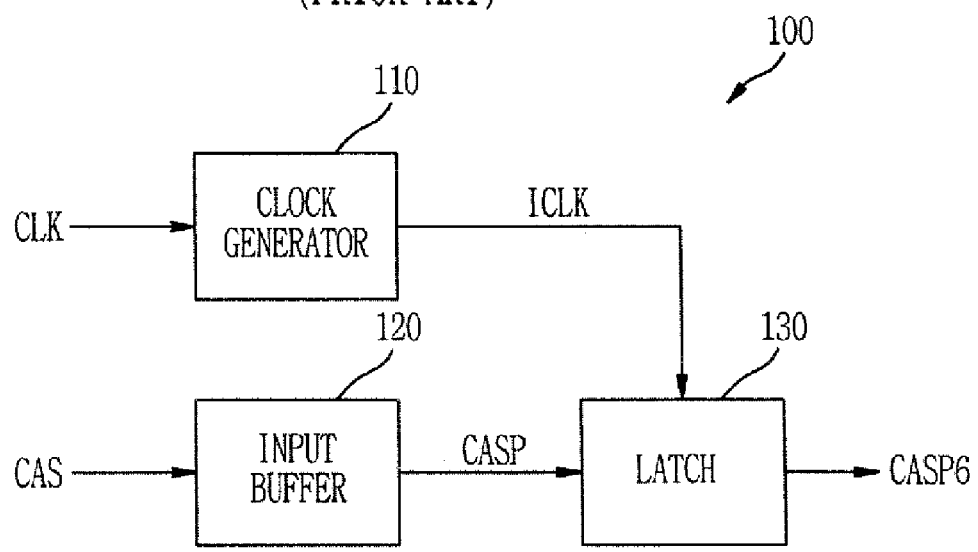
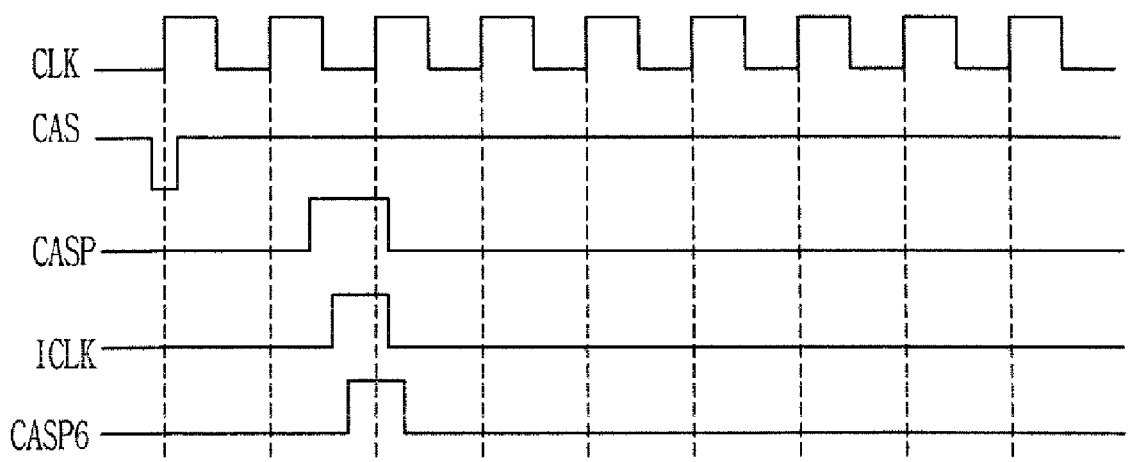

COMMAND DECODER OF SEMICONDUCTOR MEMORY DEVICE

BACKGROUND

This disclosure relates generally to a semiconductor memory device, and, more specifically, to a command decoder that controls internal circuits of a semiconductor chip to operate in synchronism with internal clocks having a pulse width, which is twice as wide as that of an external clock signal.

A conventional command decoder decodes command signals, which are applied from the outside at a rising edge of an external clock signal CLK, such as a chip select signal CS, a row address strobe signal RAS, a column address strobe signal CAS and a write enable signal WE, to generate a mode setting command MRS, an active command ACTIVE, a precharge command PRECHARGE, a write command WRITE, a read command READ and a refresh command REFRESH. Internal circuits of a semiconductor chip operate according to these commands.

FIG. 1 is a block diagram illustrating a conventional command decoder. FIG. 2 is a timing diagram showing a waveform of signals of the command decoder shown in FIG. 1. Referring to FIG. 1, the command decoder 100 includes a clock generator 110, an input buffer 120 and a latch 130.

The clock generator 100 generates an internal clock signal ICLK having the same pulse width as that of an externally applied clock signal CLK by using the external clock signal CLK. If the external clock signal CLK of 1 GHz (tCK=1 ns) is received, the clock generator 100 generates the internal clock signal ICLK having a High pulse of 500 ps. The input buffer 120 generates an internal command signal CASP using an externally applied column address strobe signal, i.e., external command signal CAS. The latch 130 generates an internal command control signal CASP6, which is synchronized to the internal clock ICLK as shown in FIG. 2, using the internal command signal CASP. The semiconductor chip operates in response to the internal command control signal CASP6.

The command decoder 100, which operates in synchronism with the internal clock signal ICLK having the same pulse width as that of the external clock signal CLK, cannot properly generate a pulse of the internal command control signal CASP6 at a low power supply voltage VDD or high temperature, under which the properties of transistors are poor, because a pulse width of the internal clock signal ICLK is too small. As a result, the semiconductor chip may operate erroneously. In this case, if the current increases for higher speed, the size of the transistor becomes large. Accordingly, there is a problem in that a chip size or the current consumed in the chip is increased.

SUMMARY

In one aspect the invention is directed to a command decoder of a semiconductor memory device. The command decoder includes an input buffer configured to buffer an externally input command signal to generate an internal command signal, and an internal operation controller configured to control internal circuits of a semiconductor chip to operate in synchronism with a first internal clock signal having a pulse width N times as wide as a pulse width of an external clock signal, if the command signal is received at a first rising edge of the external clock signal, and configured to control the internal circuits of the semiconductor chip to operate in synchronism with a second internal clock signal having an opposite phase to the first internal clock signal, if the command signal is received at a second rising edge of the external clock signal.

In another aspect, the invention is directed to a command decoder of a semiconductor memory device, including an input buffer configured to buffer an externally input command signal in synchronism with a first rising edge and a second rising edge of an external clock signal, and configured to generate an internal command signal, a first latch configured to generate a first internal command control signal synchronized to a first internal clock signal having a pulse width N times as wide as a pulse width of the external clock signal, by using the internal command signal, a second latch configured to generate a second internal command control signal synchronized to a second internal clock signal having an opposite phase to the first internal clock signal by using the internal command signal, and an internal operation controller configured to control internal circuits of a semiconductor chip to operate in response to the first internal command control signal, if the command signal is received at a first rising edge of the external clock signal, and configured to control the internal circuits of the semiconductor chip to operate in response to the second internal command control signal, if the command signal is received at a second rising edge of the external clock signal.

BRIEF DESCRIPTION OF THE DRAWINGS

FIG. 1 is a block diagram illustrating a conventional command decoder;

FIG. 2 is a timing diagram showing a waveform of signals of the command decoder shown in FIG. 2;

DETAILED DESCRIPTION

Figure 3:
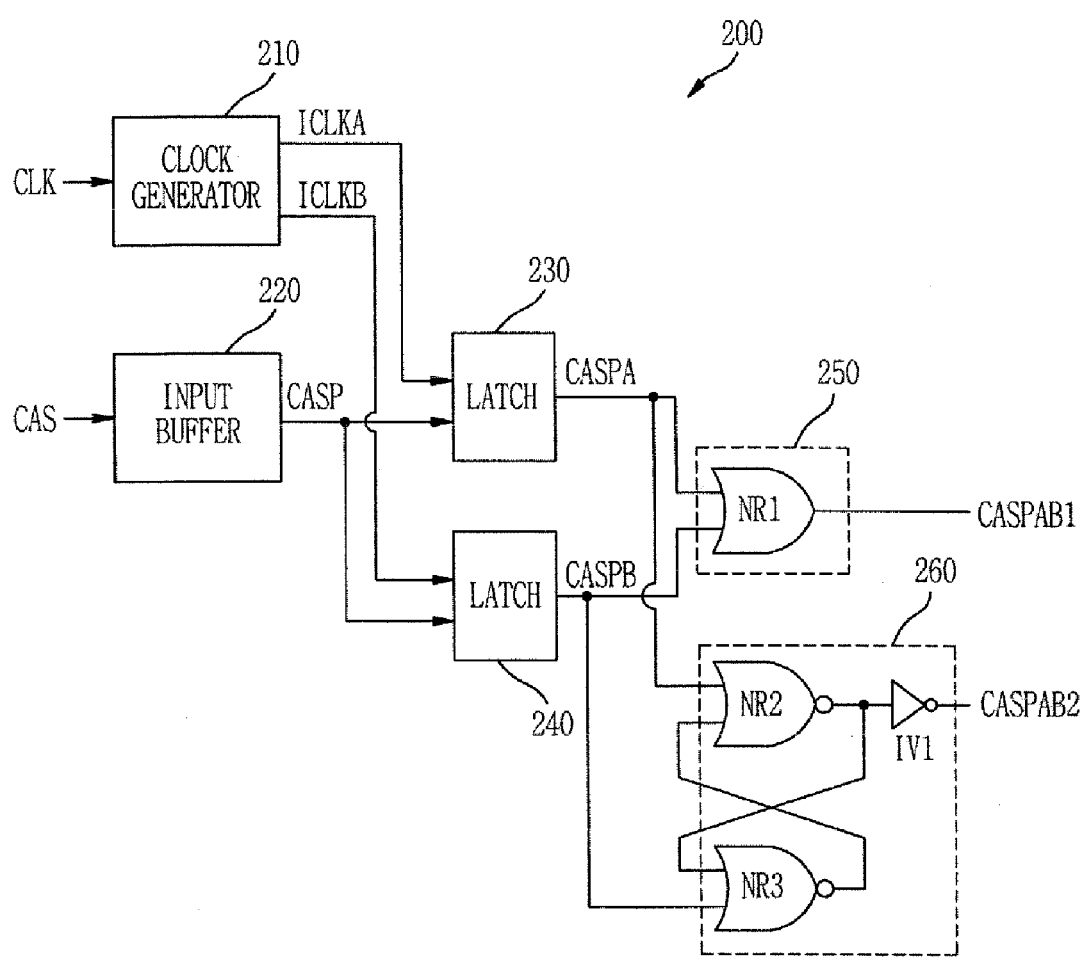
FIG. 3 is a block diagram illustrating a command decoder.
Figure 4:
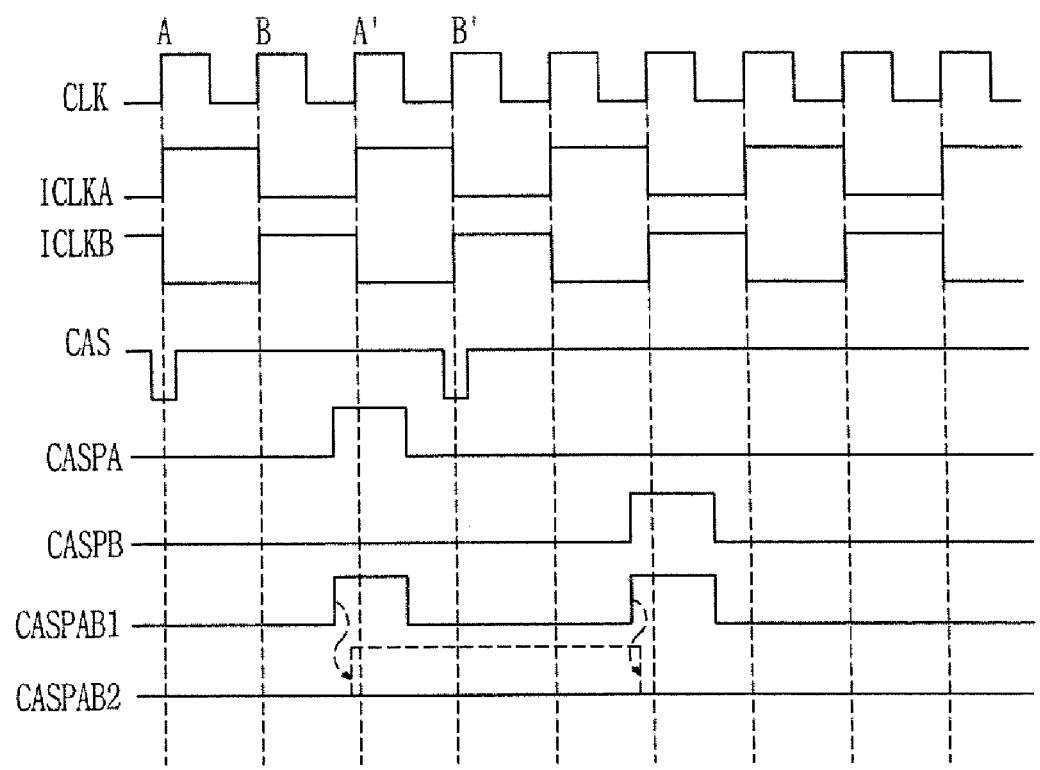
FIG. 4 is a timing diagram showing a waveform of signals of the command decoder shown in FIG. 3.

FIG. 3 is a block diagram illustrating an example of a command decoder. FIG. 4 is a timing diagram showing a waveform of signals of the command decoder shown in FIG. 3. Referring to FIG. 3, the command decoder 200 includes a clock generator 210, an input buffer 220, latches 230, 240, a summing unit 250, and an internal operation controller 260.

The clock generator 210 divides an external clock signal CLK into two to generate a first internal clock signal ICLKA that is synchronized to an "A" rising edge of the external clock signal CLK and a second internal clock signal ICLKB that is synchronized to an "B" rising edge of the external clock signal CLK, as shown in FIG. 4. The first and second internal clocks ICLKA, ICLKB have a pulse width that is twice as wide as that of the external clock signal CLK and an opposite phase to each other.

In a DRAM, command signals are usually input at the rising edge of the external clock signal CLK. If only the first internal clock signal ICLKA that is synchronized to the "A" rising edge of the external clock signal CLK shown in FIG. 4 is generated, however, command signals input at the "B" rising edge of the external clock signal CLK are not recognized. For this reason, the second internal clock signal ICLKB synchronized to the "B" rising edge of the external clock signal CLK is generated.

The input buffer 220 buffers an externally input command signal CAS such as a column address strobe signal in synchronism with the "A" rising edge and the "B" rising edge of the external clock signal CLK, as shown in FIG. 4, and generates an internal command signal CASP.

The latch 230 receives the first internal clock signal ICLKA and the internal command signal CASP to generate a first internal command control signal CASPA that is synchronized to the first internal clock signal ICLKA. The latch 240 receives the second internal clock signal ICLKB having an opposite phase to the first internal clock signal ICLKA and the internal command signal CASP to generate a second internal command control signal CASPB that is synchronized to the second internal clock signal ICLKB.

The reason why the two latches 230, 240 are utilized is that though the command signal CAS is input in synchronism with the "A" rising edge or the "B" rising edge of the external clock signal CLK, the internal circuits of the semiconductor chip can operate.

The summing unit 250 includes an OR gate NR1 for performing an OR operation on the first internal command control signal CASPA and the second internal command control signal CASPB to generate a third internal command control signal CASPAB1 that is synchronized to the first and second internal clock signals ICLKA, ICLKB.

The OR gate NR1 outputs the third internal command control signal CASPAB1 of a High level when one of the first and second internal clock signals ICLKA, ICLKB is at a High level. The reason why the summing unit 250 generates the third internal command control signal CASPAB1 is that if the number of lines increases, the chip size increases. Therefore, if the third internal command control signal CASPAB1 is generated by summing the first internal command control signal CASPA and the second internal command control signal CASPB, there is an advantage in that the number of signal lines reduces and the chip size is reduced.

The internal operation controller 260 includes NOR gate latches NR2, NR3, and an inverter IV1. The NOR gate latches NR2, NR3 perform an NOR operation on the first and second internal command control signals CASPA, CASPB, and thus latch them. The inverter IV1 inverts the output signals of the NOR gate latches NR2, NR3 to generate an internal operation control signal CASPAB2 for controlling the internal operation of the semiconductor chip.

If the first internal command control signal CASPA of a High level is input to the NOR gate latches NR2, NR3, the NOR gate latches NR2, NR3 output the signal CASPA of a Low level. The inverter IV1 then inverts the signal CASPA of the Low level, and thus outputs the internal operation control signal CASPAB2 of the High level. By doing so, the internal circuits of the semiconductor chip operate in synchronism with the first internal clock signal ICLKA. On the other hand, if the second internal command control signal CASPB of a High level is input to the NOR gate latches NR2, NR3, the NOR gate latches NR2, NR3 output the signal CASPB of a High level. The inverter IV1 inverts the signal CASPB of the High level, and thus outputs the internal operation control signal CASPAB2 of a Low level. By doing so, the internal circuits of the semiconductor chip operate in synchronism with the second internal clock signal ICLKA, which has an opposite phase to the first internal clock signal.

The internal operation controller 260 determines whether the command signal CAS has been received from the outside at the "A" rising edge of the external clock signal CLK or at the "B" rising edge of the external clock signal CLK. If it is determined that the command signal CAS has been received from the outside at the "A" rising edge of the external clock signal CLK, the internal operation controller 260 controls the internal circuits of the semiconductor chip to operate in synchronism with the first internal clock signal ICLKA. Meanwhile, if it is determined that the command signal CAS has been received from the outside at the "B" rising edge of the external clock signal CLK, the internal operation controller 260 controls the internal circuits of the semiconductor chip to operate in synchronism with the second internal clock signal ICLKB.

As described above, internal circuits of a semiconductor chip are driven in synchronism with a first internal clock signal having a pulse width, which is twice as wide as that of an external clock signal, and a second internal clock signal having an opposite phase to the first internal clock signal. Conventional problems that occur due to a small pulse width of a clock signal can be solved. Therefore, a more stabilized high-speed operation is possible.

Although certain examples of methods and apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A command decoder of a semiconductor memory device, comprising:
   an input buffer configured to buffer an externally input command signal to generate an internal command signal; and
   an internal operation controller configured to control internal circuits of a semiconductor chip to operate in synchronism with a first internal clock signal having a pulse width N times as wide as a pulse width of an external clock signal, if the command signal is received at a first rising edge of the external clock signal, and controlling the internal circuits of the semiconductor chip to operate in synchronism with a second internal clock signal having an opposite phase to the first internal clock signal, if the command signal is received at a second rising edge of the external clock signal.

2. The command decoder as claimed in claim 1, wherein the first and second internal clock signals comprise a pulse width twice as wide as the pulse width of the external clock signal.

3. The command decoder as claimed in claim 1, further comprising:
   a first latch configured to generate a first internal command control signal synchronized to the first internal clock signal, using the internal command signal; and
   a second latch configured to generate a second internal command control signal synchronized to the second internal clock signal having an opposite phase to the first internal clock signal, using the internal command signal.

4. The command decoder as claimed in claim 3, wherein the internal operation controller includes latches configured to receive the first and second internal command control signals and configured to generate an internal operation control signal for controlling the operation of internal circuits of a semiconductor chip.

5. The command decoder as claimed in claim 3, further comprising a summing unit configured to sum the first and second internal command control signals to generate a third internal command control signal.

6. The command decoder as claimed in claim 3, further comprising a clock generator configured to generate the first and second internal clock signals having a pulse width twice as wide as the pulse width of the external clock signal, by using the external clock signal.

7. A command decoder of a semiconductor memory device, comprising:
- an input buffer configured to buffer an externally input command signal in synchronism with a first rising edge and a second rising edge of an external clock signal, and configured to generate an internal command signal;
- a first latch configured to generate a first internal command control signal synchronized to a first internal clock signal having a pulse width N times as wide as a pulse width of the external clock signal, by using the internal command signal;
- a second latch configured to generate a second internal command control signal synchronized to a second internal clock signal having an opposite phase to the first internal clock signal by using the internal command signal; and
- an internal operation controller configured to control internal circuits of a semiconductor chip to operate in response to the first internal command control signal, if the command signal is received at a first rising edge of the external clock signal, and configured to control the internal circuits of the semiconductor chip to operate in response to the second internal command control signal, if the command signal is received at a second rising edge of the external clock signal.

8. The command decoder as claimed in claim 7, wherein the first and second internal clock signals comprise a pulse width twice as wide as the pulse width of the external clock signal.

9. The command decoder as claimed in claim 7, further comprising a summing unit configured to sum the first and second internal command control signals to generate a third internal command control signal.

10. The command decoder as claimed in claim 7, wherein the internal operation controller comprises latches configured to receive the first and second internal command control signals and configured to generate an internal operation control signal for controlling the operation of internal circuits of a semiconductor chip.

11. The command decoder as claimed in claim 7, further comprising a clock generator configured to generate the first and second internal clock signals having a pulse width twice as wide as the pulse width of the external clock signal, by using the external clock signal.

* * * * *